(12) United States Patent
Lee et al.

(10) Patent No.: US 9,373,794 B2
(45) Date of Patent: Jun. 21, 2016

(54) PHOSPHORESCENT COMPOUNDS AND ORGANIC LIGHT EMITTING DIODE DEVICES USING THE SAME

(71) Applicant: LG DISPLAY CO., LTD., Seoul (KR)

(72) Inventors: Bangsook Lee, Seoul (KR); Jongkwan Bin, Paju-si (KR); Bomin Seo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 382 days.

(21) Appl. No.: 14/100,852

(22) Filed: Dec. 9, 2013

(65) Prior Publication Data
US 2014/0175406 A1    Jun. 26, 2014

(30) Foreign Application Priority Data

Dec. 26, 2012  (KR) .................. 10-2012-0152788

(51) Int. Cl.
    *H01L 51/50*    (2006.01)
    *H01L 51/00*    (2006.01)

(52) U.S. Cl.
CPC ........ *H01L 51/0072* (2013.01); *H01L 51/0074* (2013.01); *H01L 51/0094* (2013.01); *H01L 51/5016* (2013.01)

(58) Field of Classification Search
None
See application file for complete search history.

(56) References Cited

FOREIGN PATENT DOCUMENTS

| CN | 101827834 A | 9/2010 |
| CN | 102558175 A | 7/2012 |
| JP | 2007-057307 | * 3/2009 .............. C09K 11/06 |

OTHER PUBLICATIONS

Office Action dated Jun. 24, 2015 for corresponding Chinese Patent Application No. 201310647909.1, 12 pages.

* cited by examiner

Primary Examiner — Gregory Clark
(74) Attorney, Agent, or Firm — Brinks Gilson & Lione

(57) ABSTRACT

A phosphorescent compound is disclosed. The phosphorescent compound represented by the following Chemical Formula 1,

[Chemical Formula 1]

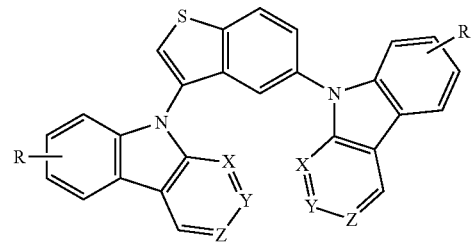

where X, Y, and Z are each selected from the group consisting of carbon and nitrogen, and when x, y, and z are all carbon, R is any one selected from the group consisting of carbazole, α-carboline, β-carboline, γ-carboline, fluorine, dibenzothiophene, dibenzofuran, triphenylsilane, tetraphenylsilane, pyridine, quinoline, isoquinoline, pyrimidine, diphenylphosphineoxide, and substituents thereof.

9 Claims, 1 Drawing Sheet

PHOSPHORESCENT COMPOUNDS AND ORGANIC LIGHT EMITTING DIODE DEVICES USING THE SAME

This application claims the benefit of priority to Korean Patent Application No. 10-2012-0152788 filed on Dec. 26, 2012, which is incorporated herein by reference for all purposes as if fully set forth herein.

BACKGROUND

1. Field of the Disclosure

This document relates to phosphorescent compounds and organic light emitting devices using the same, and more particularly, to organic light emitting diode devices using phosphorescent compounds having high triplet energy as the host of an emission layer.

2. Discussion of the Related Art

With the development of multimedia, flat panel displays (FDPs) are becoming more and more important. Accordingly, a variety of flat panel displays such as liquid crystal display (LCDs), plasma display panels (PDPs), field emission displays (FEDs), organic light emitting diode devices, and the like are put to practical use.

Among them, an organic light emitting diode device can be formed on a flexible transparent substrate, such as plastic, can be driven at a lower voltage (below 10V) than a plasma display panel or inorganic light emitting diode display, has relatively low power consumption, and has a superior color sense. Further, the organic light emitting diode device can represent three colors of green, blue and red, and thus is drawing a great deal of attention as a next-generation full-color display device.

The organic light emitting diode device can be formed by sequentially laminating an anode, a hole injection layer, a hole transport layer, an emission layer, and electron transport layer, an electron injection layer, and a cathode. For a light-emitting material, holes injected from the anode are recombined with electrons injected from the cathode to form excitons. Singlet excitons and triplet excitons are involved in the fluorescence and phosphorescence processes, respectively. In recent years, there is a growing trend that phosphorescent materials are replacing fluorescent materials. For a fluorescent material, singlets representing only 25% of excitons formed in the emission layer are used to produce light, and triplets representing 75% of the excitons are mostly lost and transformed into heat. On the other hand, phosphorescent material has a light emission mechanism for converting both singlet and triplet excitons into light.

A light emitting process of a phosphorescent material will be discussed briefly. Holes injected from the anode and electrons injected from the cathode meet in a host material of the emission layer. Thought a hole and an electron may be paired in a dopant in some cases, generally, a large amount of holes and electrons meet in the host due to high concentration of the host. At this point, energy transfer takes place from the singlet excitons formed in the host to the singlets or triplets of the dopant, and energy transfers takes place from the triplet excitons to the triplets of the dopant.

Since the excitons transferred to the singlets of the dopant are transferred to the triplets of the dopant by intersystem crossing, the first destination of all the excitons is a triplet level of the dopant. The thus-formed excitons are transferred to the ground state, and emit light. If the triplet energy of the hole transport layer or electron transport layer adjacent to the front and back of the emission layer is less than the triplet energy of the dopant, backward energy transfer takes place from the dopant or host to these layers, and this leads to an abrupt decrease in efficiency. Accordingly, the triplet energy of the hole/electron transport layers, as well as the host material of the emission layer, plays a very important role in phosphorescent devices.

For efficient energy transfer from the host to the dopant, the triplet energy of the host needs to be greater than the triplet energy of the dopant. For example, CBP, which is recently widely used, has a triplet energy of 2.6 eV. Therefore, in the case of a well-known Firpic phosphorescent dopant, backward energy transfer (thermal absorption) occurs from the host to the dopant, thus causing a decrease in efficiency. Moreover, high glass transfer temperature is required because low glass transfer temperature of materials affects thermal stability and weakens the properties of the device. Accordingly, there is an urgent need for the development of novel phosphorescent materials with high glass transfer temperature.

SUMMARY

In one aspect, there is a phosphorescent compound represented by the following Chemical Formula 1,

[Chemical Formula 1]

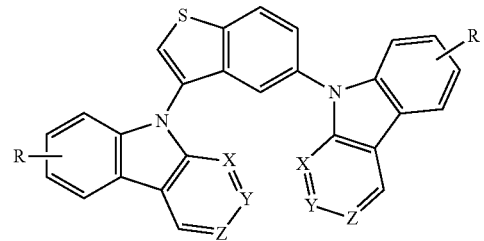

where X, Y, and Z are each selected from the group consisting of carbon and nitrogen, except when x, y, and z are all carbon, and R is any one selected from the group consisting of carbazole, α-carboline, ρ-carboline, γ-carboline, fluorine, dibenzothiophene, dibenzofuran, triphenylsilane, tetraphenylsilane, pyridine, quinoline, isoquinoline, pyrimidine, diphenylphosphineoxide, and substituents thereof.

In another aspect, there is an organic light emitting diode device comprising an organic film formed between an anode and a cathode, the organic film comprising the phosphorescent compound.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
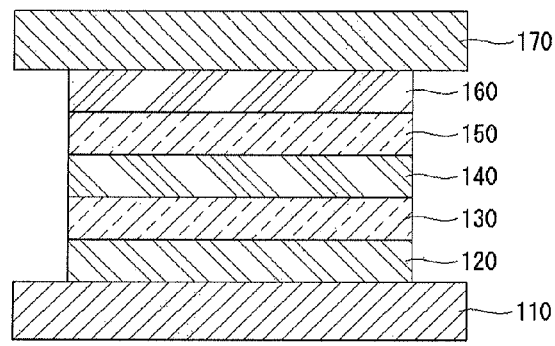
FIG. 1 is a view showing an organic light emitting diode device in accordance with an exemplary embodiment of the present invention.

FIG. 1 is a view showing an organic light emitting diode device in accordance with an exemplary embodiment of the present invention.

Referring to FIG. 1, the organic light emitting diode device 100 in accordance with the exemplary embodiment of the present invention may comprise an anode 110, a hole injection layer 120, a hole transport layer 130, an emission layer 140, an electron transport layer 150, an electron injection layer 160, and a cathode 170.

The anode 110 is a hole injection electrode which is formed of one of ITO (Indium Tin Oxide), IZO (Indium Zinc Oxide), and ZnO (Zinc Oxide) having a high work function. If the anode 110 is a reflective electrode, the anode 110 may further comprise a reflective layer formed of one of aluminum (Al), silver (Ag), or nickel (Ni) under the layer formed of one of ITO, IZO, and ZnO.

The hole injection layer 120 functions to facilitate the injection of holes from the anode 110 to the emission layer 140. The hole injection layer 120 may be formed of at least one selected from the group consisting of copper phthalocyanine (CuPc), PEDOT (poly(3,4)-ethylenedioxythiophene), polyaniline (PANI), and NPD (N,N-dinaphthyl-N,N'-diphenyl benzidine), but is not limited thereto.

The thickness of the hole injection layer 120 may range from 1 to 150 nm. If the thickness of the hole injection layer 120 is 1 nm or greater, a reduction in a hole injection characteristic can be prevented. If the thickness of the hole injection layer 120 is 150 nm or less, an increase in driving voltage, which is applied in order to increase the movement of holes when the thickness of the hole injection layer 120 is too large, can be prevented.

The hole transport layer 130 functions to smoothly transport holes. The hole transport layer 130 may be formed of at least one selected from the group consisting of NPD (N,N-dinaphthyl-N,N'-diphenyl benzidine), TPD (N,N'-bis-(3-methylphenyl)-N,N'-bis-(phenyl)-benzidine, s-TAD and MTDATA (4,4',4''-Tris(N-3-methylphenyl-N-phenyl-amino)-triphenylamine), but is not limited thereto.

The hole transport layer 130 may also have a thickness of 1 to 150 nm. If the thickness of the hole transport layer 130 is 5 nm or more, a reduction in a hole transport characteristic can be prevented. If the thickness of the hole transport layer 130 is 150 nm or less, an increase in the driving voltage, which is applied in order to increase the movement of holes when the thickness of the hole transport layer 130 is too large, can be prevented.

The emission layer 140 may be made of a material that emits red, green, and blue color light. This material may comprise a phosphorescent or fluorescent material. This exemplary embodiment will be described with respect to phosphorescent compounds of an emission layer that emit green light and blue light.

The emission layer 140 of the present invention comprises a host and a dopant. More specifically, the host of the present invention may be a phosphorescent compound represented by the following Chemical Formula 1:

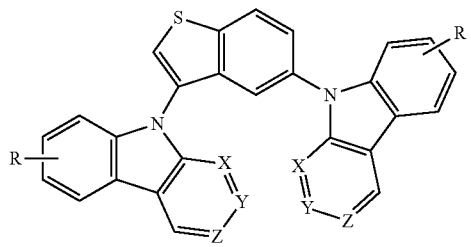

[Chemical Formula 1]

where X, Y, and Z are each selected from the group consisting of carbon and nitrogen, except when x, y, and z are all carbon, and R is any one selected from the group consisting of carbazole, α-carboline, β-carboline, γ-carboline, fluorine, dibenzothiophene, dibenzofuran, triphenylsilane, tetraphenylsilane, pyridine, quinoline, isoquinoline, pyrimidine, diphenylphosphineoxide, and substituents thereof.

Carboline comprising X, Y, and Z may be any one selected from the group consisting of α-carboline where X is nitrogen and Y and Z are carbon, β-carboline where Y is nitrogen and X and Z are carbon, and γ-carboline where Z is nitrogen and X and Y are carbon.

The substituents of R may be selected from the group consisting of phenylsilyl, halogen, cyano, C1-C13 aryl, pyridyl, alkyl, alkenyl, alkynyl, and alkoxy.

More specifically, R may be any one selected from the group consisting of compounds represented by the following Chemical Formula 2:

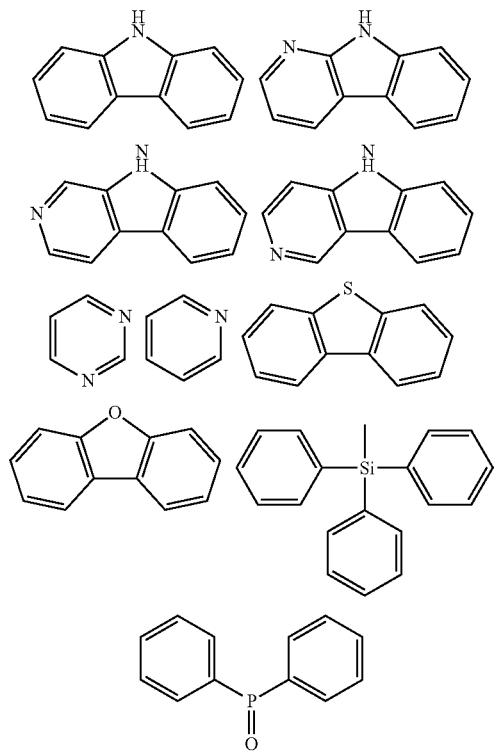

[Chemical Formula 2]

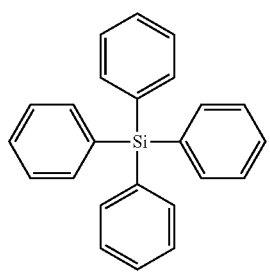
where the phosphorescent compound may be any one selected from the compounds represented below:
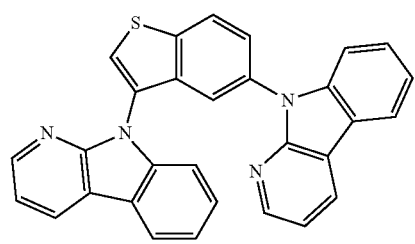
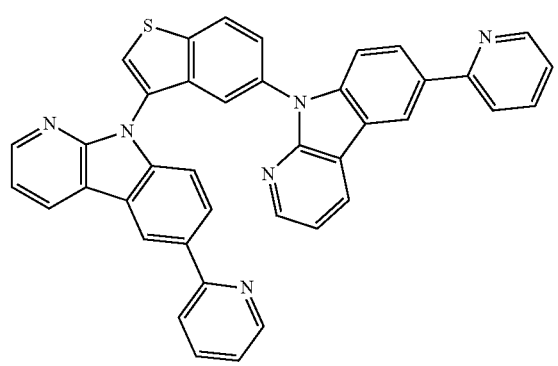
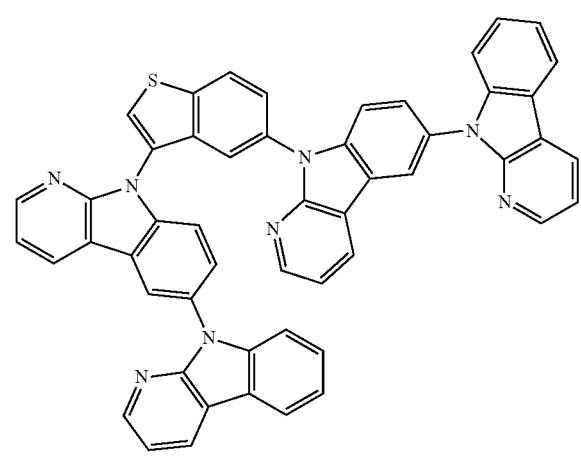
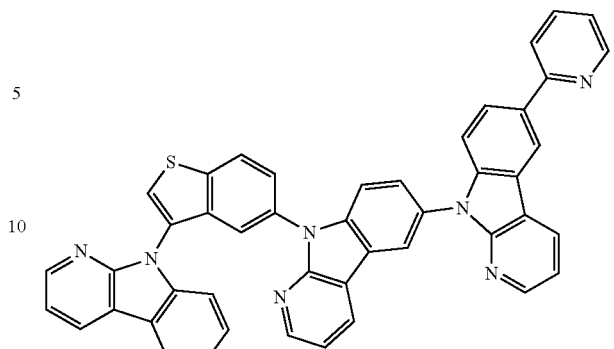
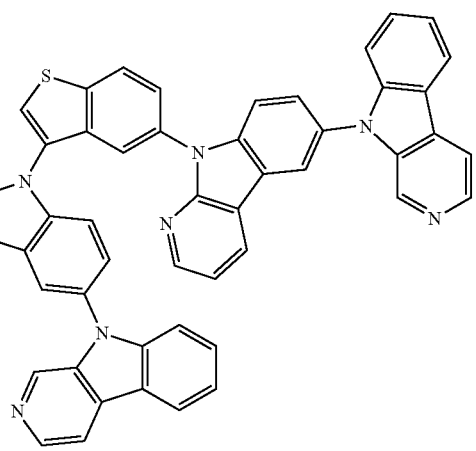
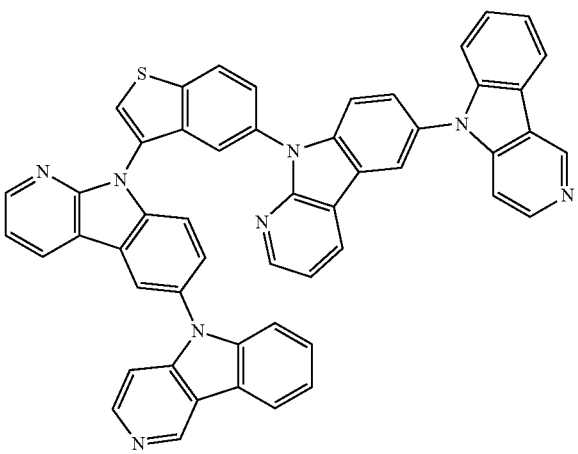

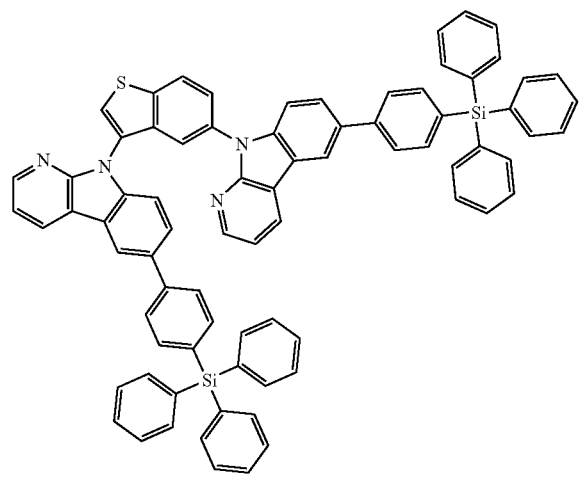
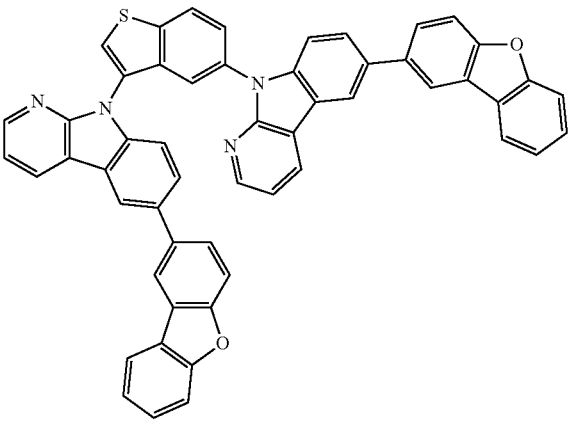
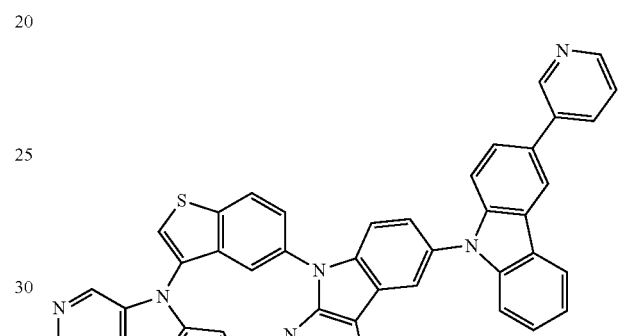
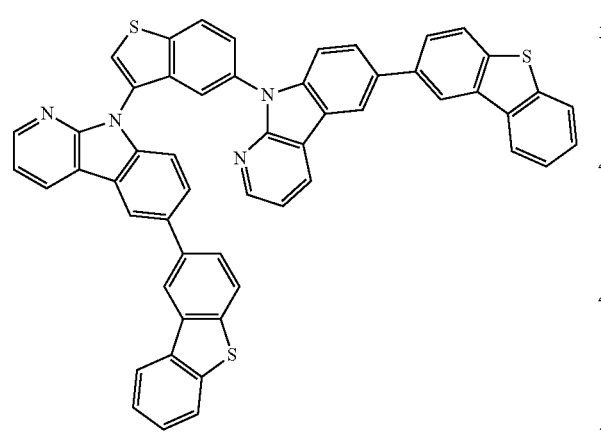
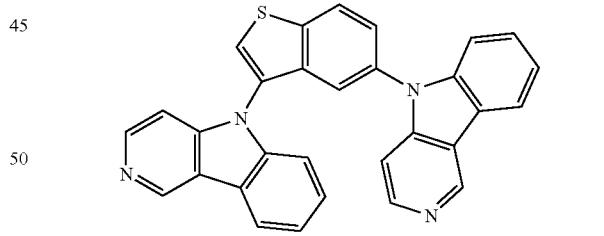
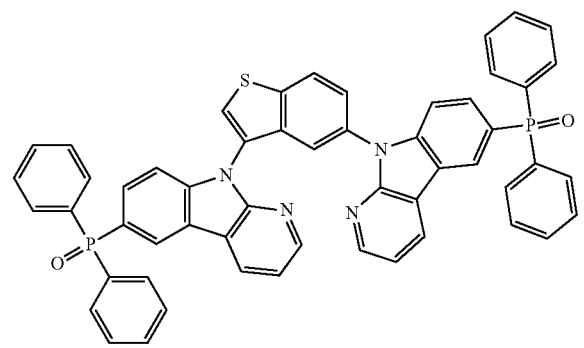
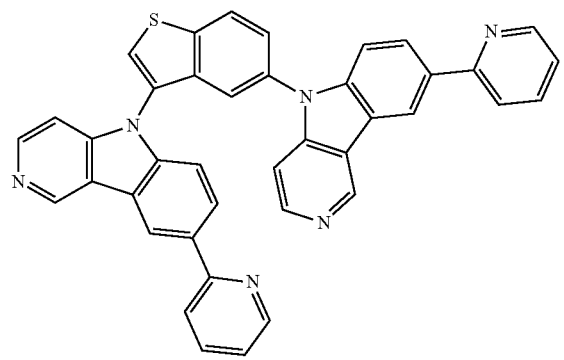

-continued
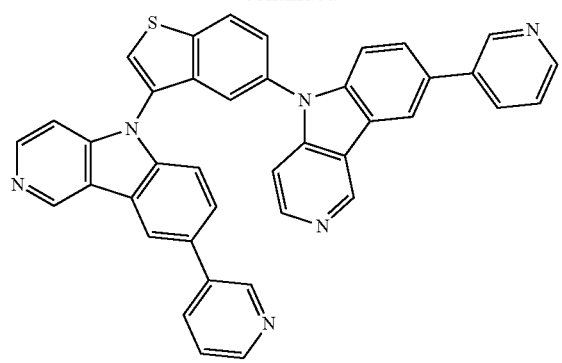
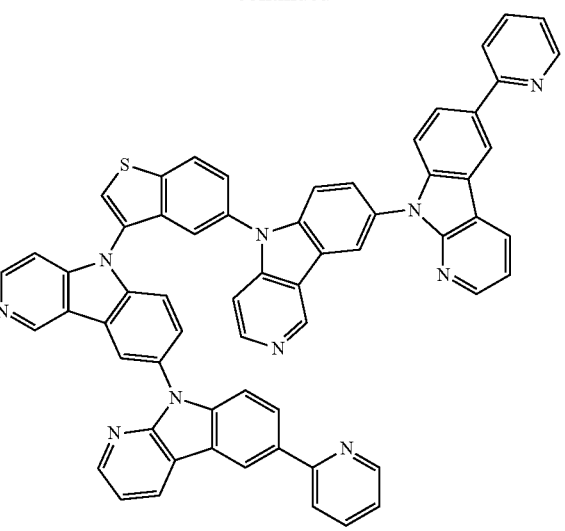
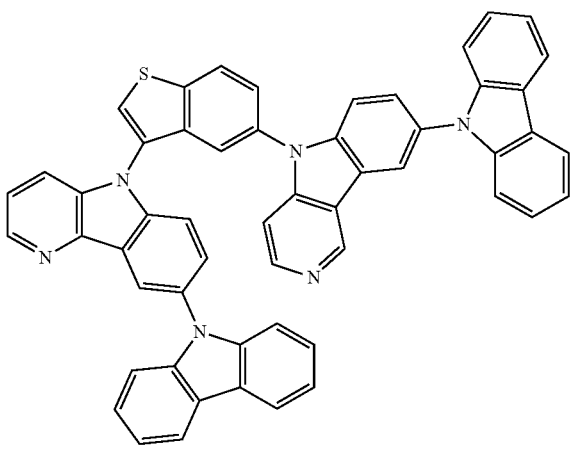
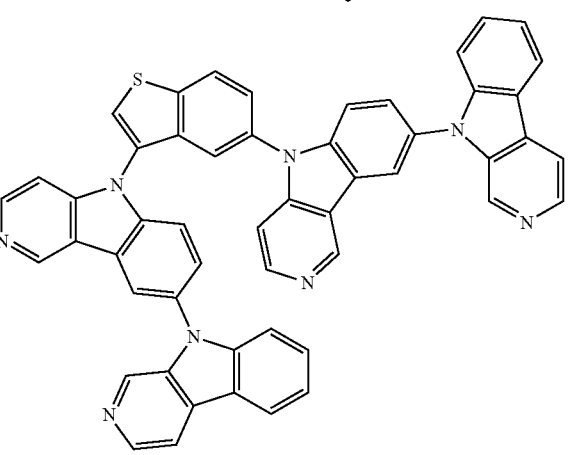
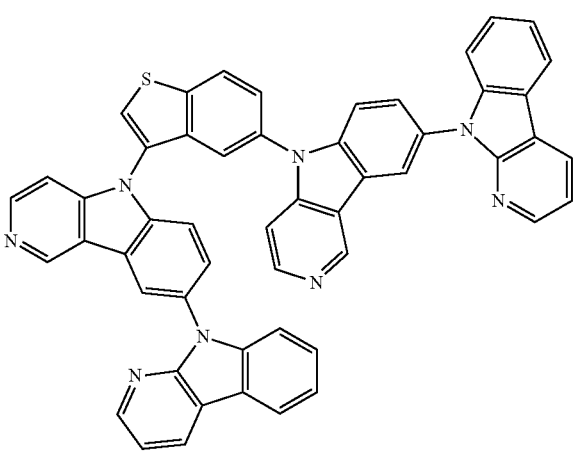
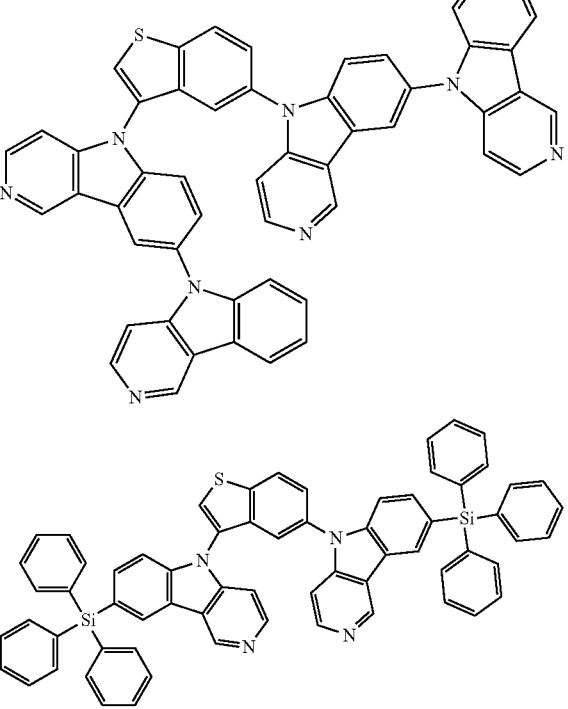

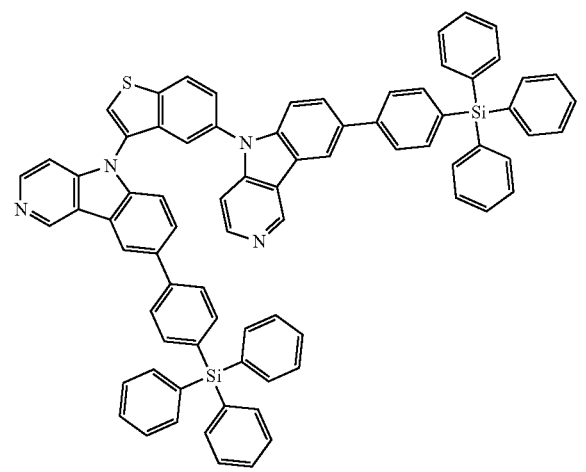
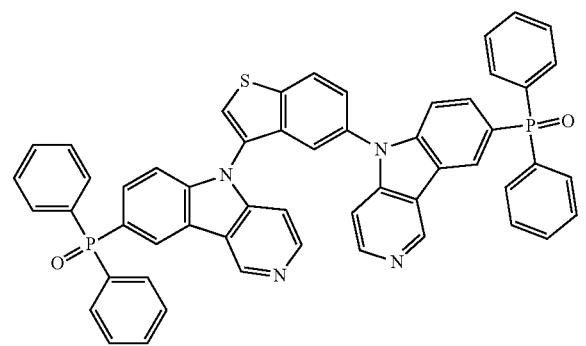
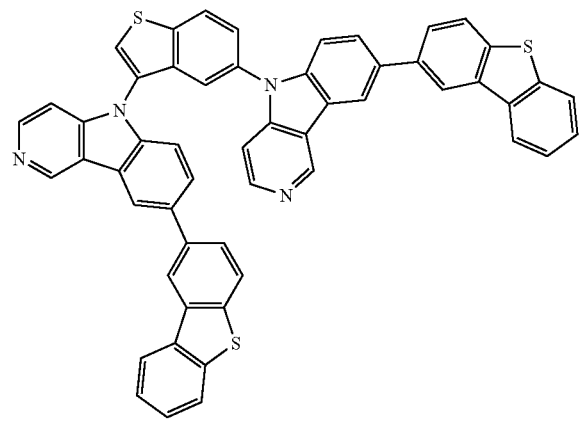
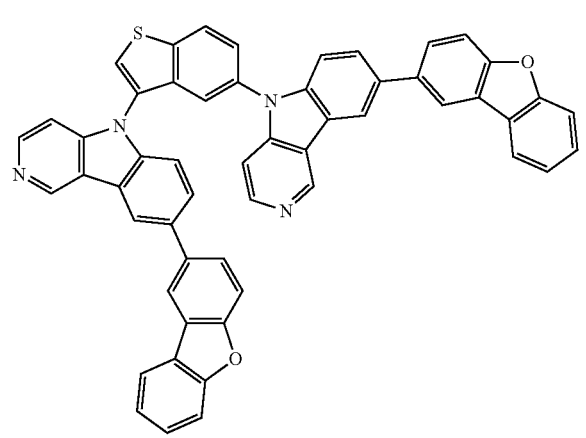
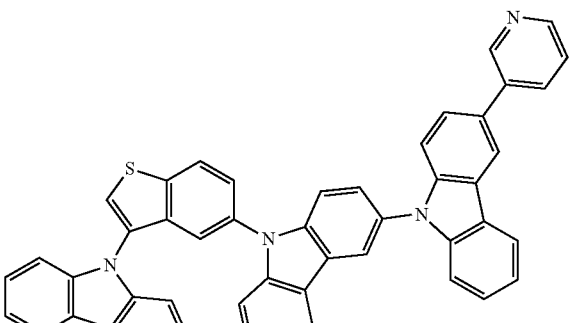
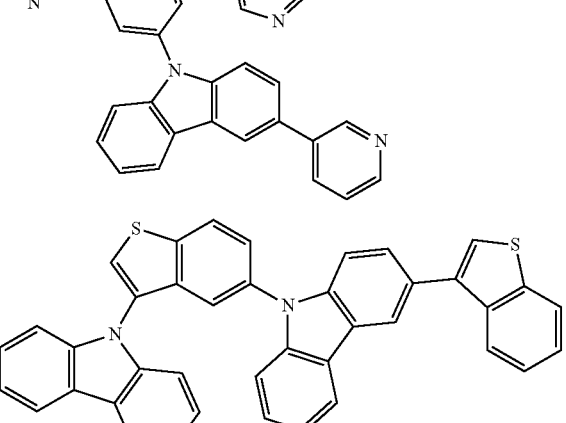
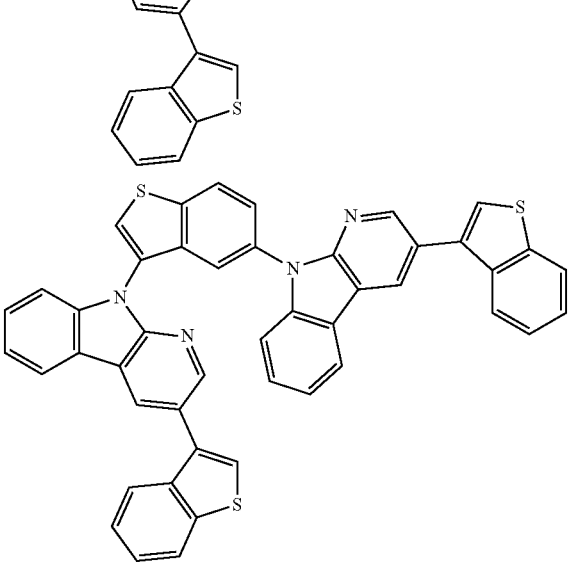

-continued

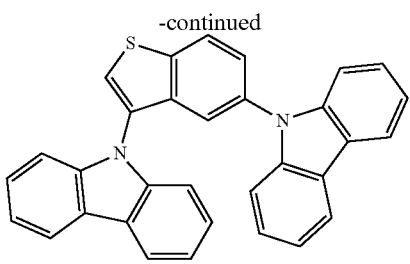

The phosphorescent compound of the present invention is a sulfur-containing heteroaromatic compound. This compound may be expected to have bipolarity by using carbazole showing hole properties and a group of sulfur compounds showing electron properties. This may contribute to achieving balance between holes and electrons in the organic light emitting diode device.

The hole transport layer 150 functions to smoothly transport holes. The hole transport layer 150 may be formed of at least one selected from the group consisting of Alq3(tris(8-hydroxyquinolino)aluminum, PBD, TAZ, spiro-PBD, BAlq, and SAlq, but is not limited thereto.

The hole transport layer 150 may also have a thickness of 1 to 50 nm. If the thickness of the hole transport layer 150 is 1 nm or greater, a reduction in a hole transport characteristic can be prevented. If the thickness of the hole transport layer 150 is 50 nm or less, an increase in the driving voltage, which is applied in order to increase movement of holes when the thickness of the hole transport layer 150 is too large, can be prevented.

The electron injection layer 160 functions to facilitate the injection of electrons. The electron injection layer 160 may be formed of Alq3(tris(8-hydroxyquinolino)aluminum), PBD, TAZ, spiro-PBD, BAlq or SAlq, but is not limited thereto.

The thickness of the hole injection layer 160 may range from about 1 to about 50 nm. If the thickness of the hole injection layer 160 is 1 nm or greater, a reduction in a hole injection characteristic can be prevented. If the thickness of the hole injection layer 160 is 50 nm or less, an increase in driving voltage, which is applied in order to increase the movement of holes when the thickness of the hole injection layer 160 is too large, can be prevented.

The cathode 170 is an electron injection electrode which is formed of magnesium (Mg), calcium (Ca), aluminum (Al), and silver (Ag) having a low work function, or an alloy thereof. In the case that the organic light emitting diode device has a top emission or dual emission structure, the cathode 170 may be formed thin enough to transmit light. In the case that the organic light emitting diode device has a bottom emission structure, the cathode 170 may be formed thick enough to reflect light.

Hereinafter, phosphorescent compounds of the present invention and the properties of these compounds will be described in detail in the following Examples. However, it should be noted that the following Examples are merely illustrative of the present invention, and the present invention is not limited thereto.

EXAMPLES

1) Synthesis of (4-chlorophenyl) (2,2-diethoxyethyl)sulfane

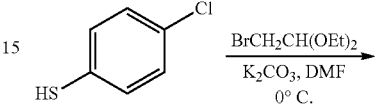

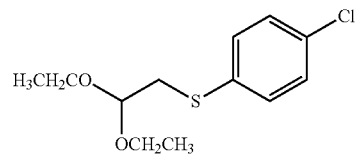

In a 250 mL 2-neck round flask, 4-chlorobenzenethiol (10.0 g, 69 mmol), K2CO3 (9.52 g, 69 mmol), and dimethylformamide (DMF) (100 mL) were poured and stirred, and then 2-bromo-1,1-diethoxyethane (16.3 g, 82.8 mmol) was dissolved in dimethylformamide (100 mL) and gradually added to the aforementioned mixture solution at 0° C. After the reaction, an organic solvent was extracted with ethyl acetate (EtOAc) (250 mL) and water (200 mL), and then dried over MgSO4. After column chromatography using ethyl acetate/petroleum ether (EtOAc/PE=1:60), the solution was distilled in vacuum to give 9.0 g of yellow oil (50% yield).

2) Synthesis of 5-chlorobenzo[b]thiophene

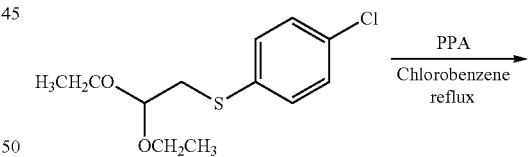

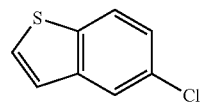

In a 250 mL 2-neck round flask, 4-chlorophenyl) (2,2-diethoxyethyl)sulfane (5 g, 19 mmol) and chlorobenzene (4 mL) were poured, and then the reaction mixture was added to a polyacrylic acid (PAA) reaction solution (5 g) obtained after boiling in chlorobenzen (5 mL). After the reaction, ice water (25 mL) was added to the mixture, and the mixture was washed with brine (50 mL) and dried over Na2SO4. The mixture was subjected to column chromatography using petroleum ether to give 2.9 g of white solid (90% yield).

3) Synthesis of 3-bromo-5-chlorobenzo[b]thiophene

In a 250 mL 2-neck round flask, 5-chlorobenzothiophene (2 g, 11.8 mmol) was dissolved in dichloromethane (10 mL), and sodium acetate (NaOAc) (1.95 g, 23.6 mmol) and Br2 (1.89 g, 11.8 mmol) were gradually added to the mixture for 5 minutes at 0□. After the reaction, a 10% sodium bisulfate (NaHSO3) solution (20 mL) was poured to the mixture, and then the resulting mixture was extracted with ethyl acetate (20 mL), dried over MgSO4, and distilled in vacuum to give 2.49 g of yellow solid (85% yield).

4) Synthesis of (9-(5-chlorobenzo[b]thiophen-3-yl)-9H-carbazole

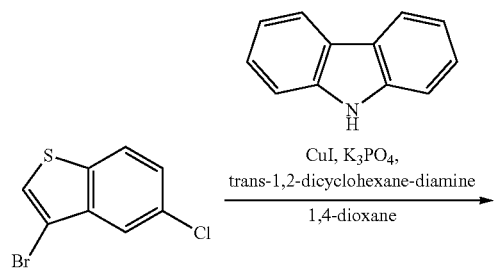

In a 250 mL 2-neck round flask 3-bromo-5-chlorobenzothiophene (2 g, 8.1 mmol), carbazole (0.675 g, 4.05 mmol), CuI (0.46 g, 24.3 mmol), trans-1,2-dicyclohexane-diamine (0.92 g, 2.43 mmol), K3PO4 (3.43 g, 16.2 mmol), and 150 mL of 1,4-dioxane were poured, and refluxed and stirred. After the reaction, the solid matter was filtered. And after the organic solvent was distilled in vacuum and removed, column chromatography (Hex:E.A=9:1) is performed, the solution was distilled in vacuum, giving 1.75 g of white solid (65% yield).

5) Synthesis of 9,9'-(benzo[b]thiophene-3,5-diyl)bis(9H-carbazole)

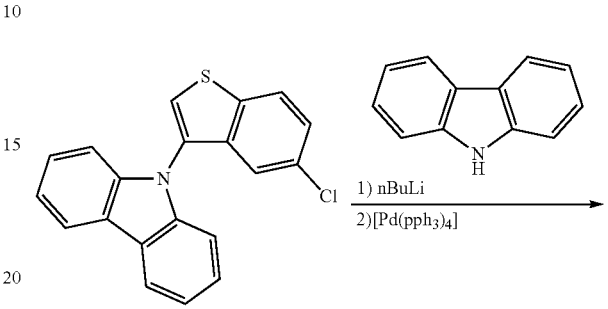

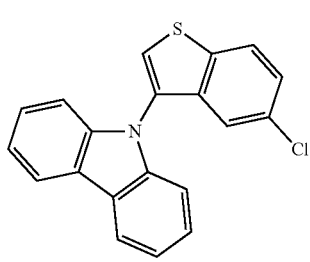

A-1

In a 250 mL 2-neck round flask, 5 mL of tetrahydrofuran (THF) was poured to carbazole (0.75 g, 4.5 mmol). Then, a 2.5Mn-butyllithium/hexane solution (1.8 ml) was gradually added to the mixture in an ice bath. This mixture solution was stirred at room temperature for minutes, and then 9-(5-chlorobenzothiophen-3-yl)carbazole (1.5 g, 4.5 mmol) and tetrakis(triphenylphosphine)palladium(0) (Pd(pph3)4) (0.024 g) were poured to the mixture solution, the resulting mixture was dissolved in and tetrahydrofuran, and reacted at 80° C. After the reaction, the precipitate was filtered and recrystallized with dichloromethane and methanol, thereby giving 1.71 g of a product (82%).

Figure 2:
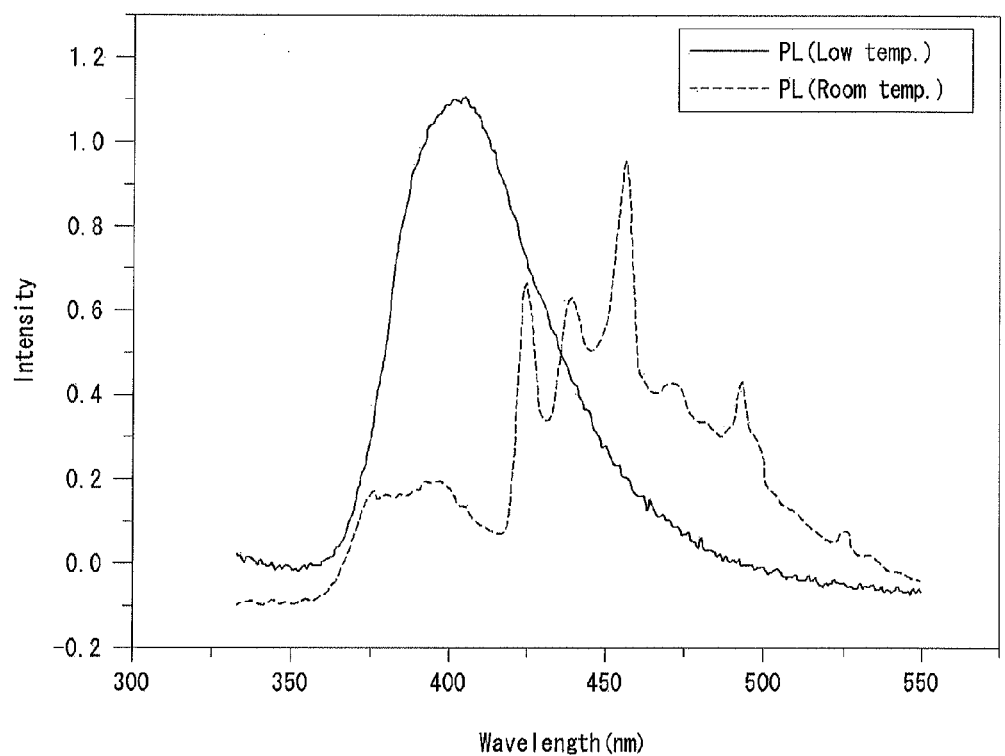
FIG. 2 is a graph showing measurements of the UV absorption spectrum and low-temperature (77K) PL spectrum of the host of the present invention.

FIG. 2 shows measurements of the UV absorption spectrum and low-temperature (77K) PL spectrum of the host produced in accordance with the exemplary embodiment of the present invention. A comparison between these measurements and the properties of conventional host materials CBP and mCP and shown in Table 1.

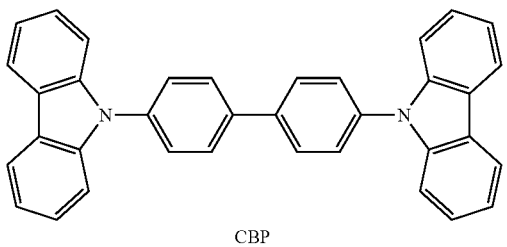

CBP

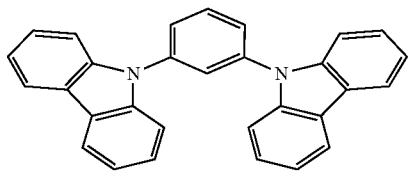

mCP

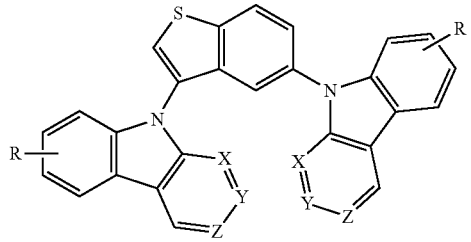

[Chemical Formula 1]

where X, Y, and Z are each selected from the group consisting of carbon and nitrogen, and R is any one selected from the group consisting of H, carbazole, α-carboline, β-carboline, γ-carboline, fluorine, dibenzothiophene, dibenzofuran, triphenylsilane, tetraphenylsilane, pyridine, quinoline, isoquinoline, pyrimidine, diphenylphosphineoxide, and substituents thereof.

TABLE 1

| | Wavelength at peak level of UV absorption spectrum (nm) | Wavelength at peak level of PL spectrum (nm) | Energy band gap | LUMO level (eV) | HOMO level (eV) | Triplet energy (eV) | Glass transfer temperature (Tg) (□) |
|---|---|---|---|---|---|---|---|
| CBP | 359 | 278 | 3.46 | −2.5 | −6.0 | 2.6 | — |
| mCP | 355 | 421 | 3.5 | −2.4 | −5.9 | 2.95 | 55 |
| host | 365 | 424 | 3.40 | −2.43 | −5.83 | 2.92 | 179 |

Referring to Table 1 and FIG. 2, it was found out that the triplet energy of the host material produced in accordance with the exemplary embodiment of the present invention was higher than that of CBP of 2.6 eV, and the glass transfer temperature thereof was higher than that of mCP.

According to the phosphorescent compounds and the organic light emitting diode devices in accordance with the exemplary embodiment of the present invention, novel phosphorescent compounds having high triplet energy and high glass transfer temperature are produced, and these phosphorescent compounds are formed as the host of the emission layer, thereby making energy transfer in the emission layer easier and improving light emission efficiency.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A phosphorescent compound represented by the following Chemical Formula 1:

2. The phosphorescent compound of claim 1, wherein carboline comprising X, Y, and Z is any one selected from the group consisting of α-carboline where X is nitrogen and Y and Z are carbon, β-carboline where Y is nitrogen and X and Z are carbon, and γ-carboline where Z is nitrogen and X and Y are carbon.

3. The phosphorescent compound of claim 1, wherein R is any one selected from the group consisting of compounds represented by the following Chemical Formula 2:

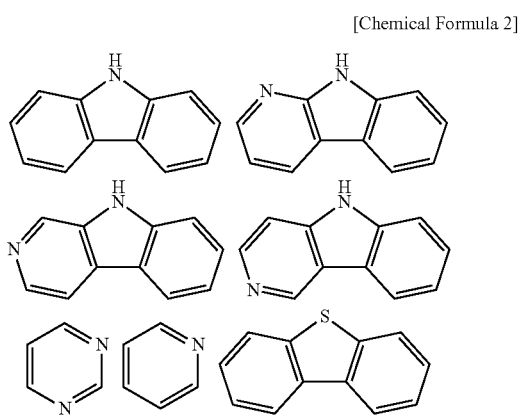

[Chemical Formula 2]

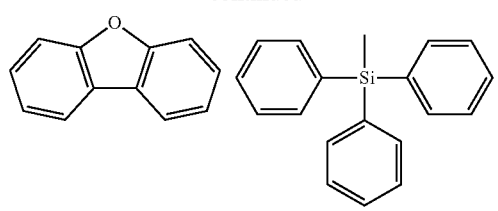
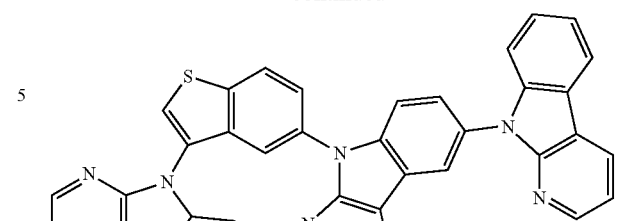
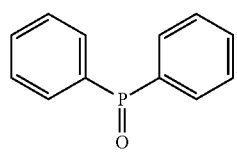
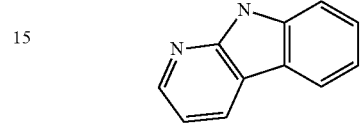
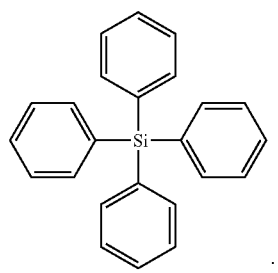
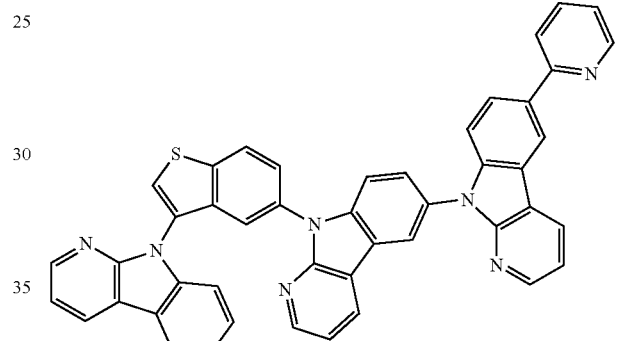
4. The phosphorescent compound of claim 1, wherein the phosphorescent compound is any one selected from the compounds set forth below:
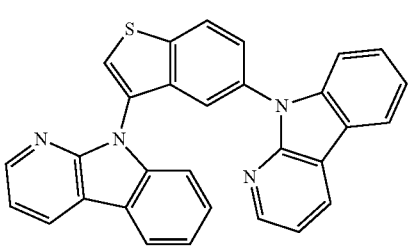
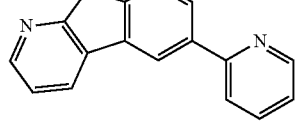
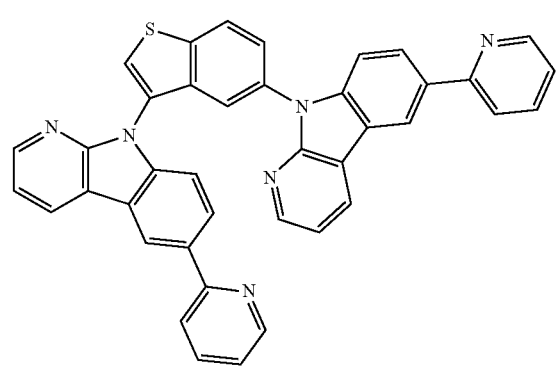
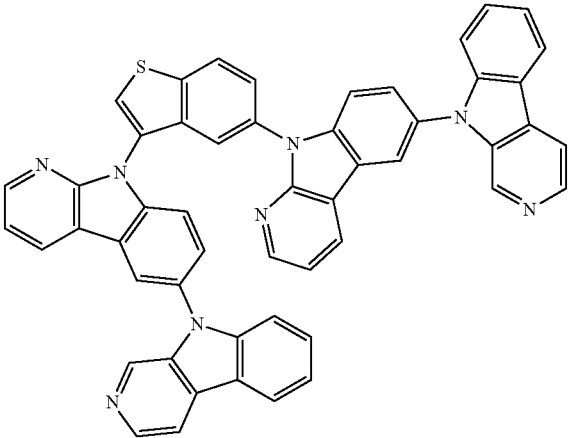

21
-continued
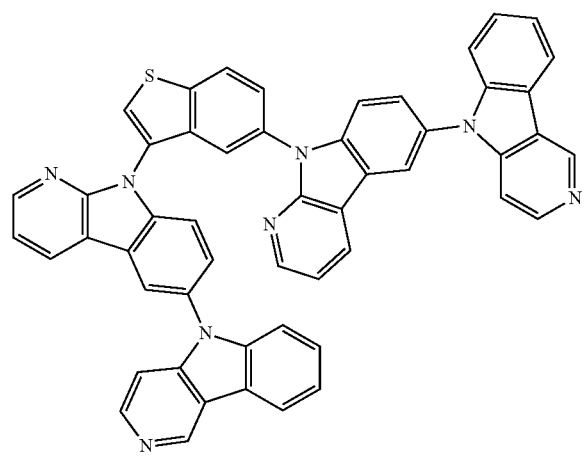
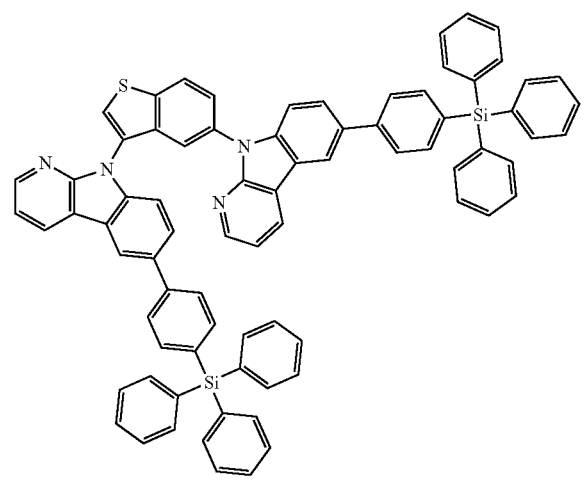
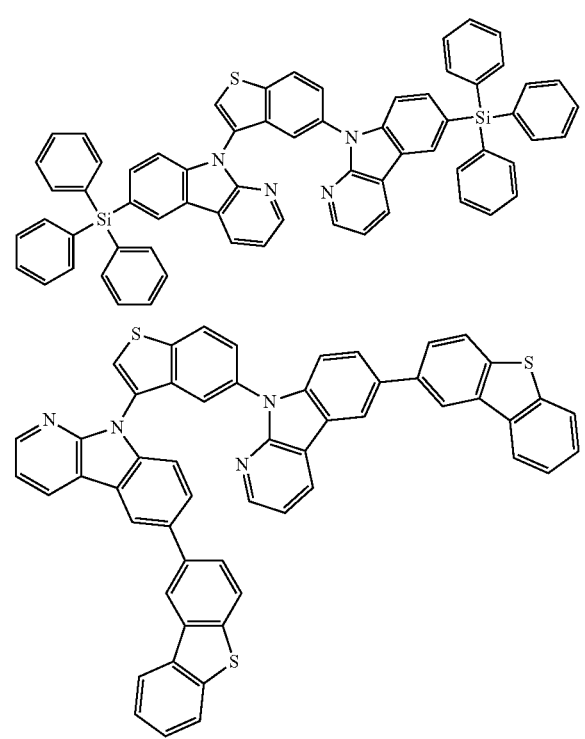
22
-continued
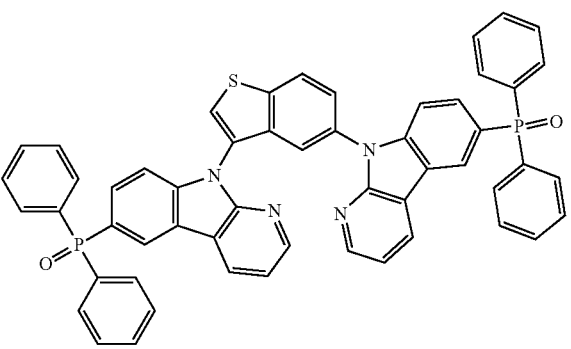
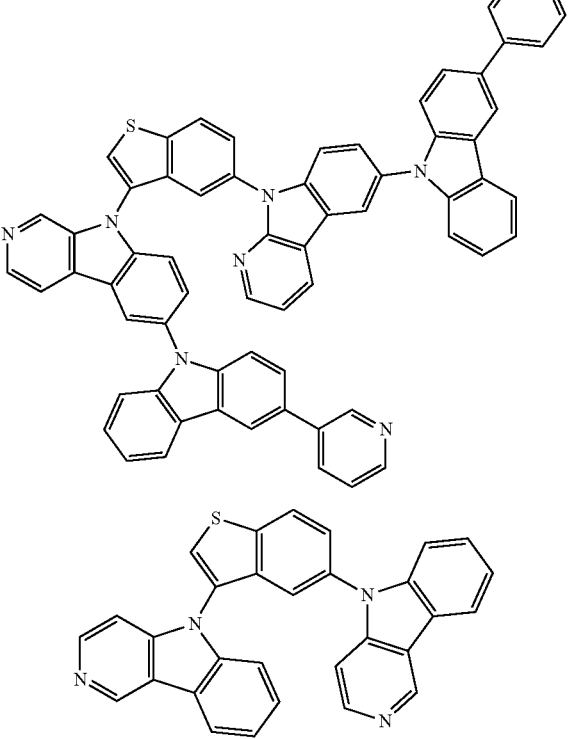

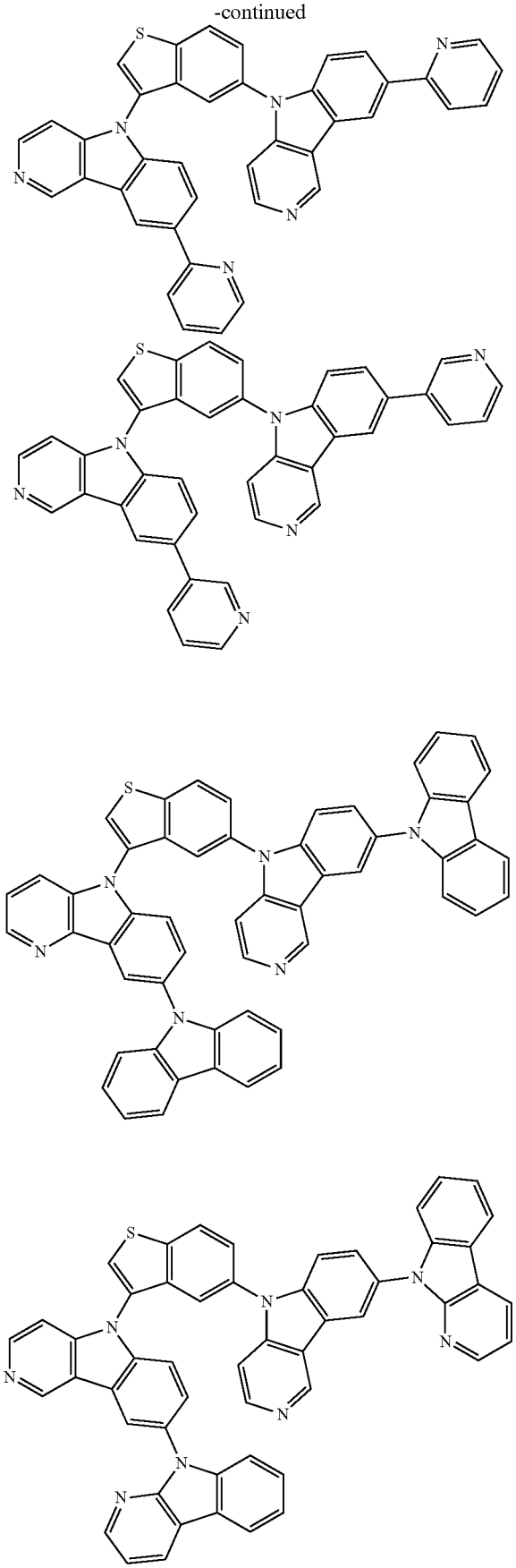
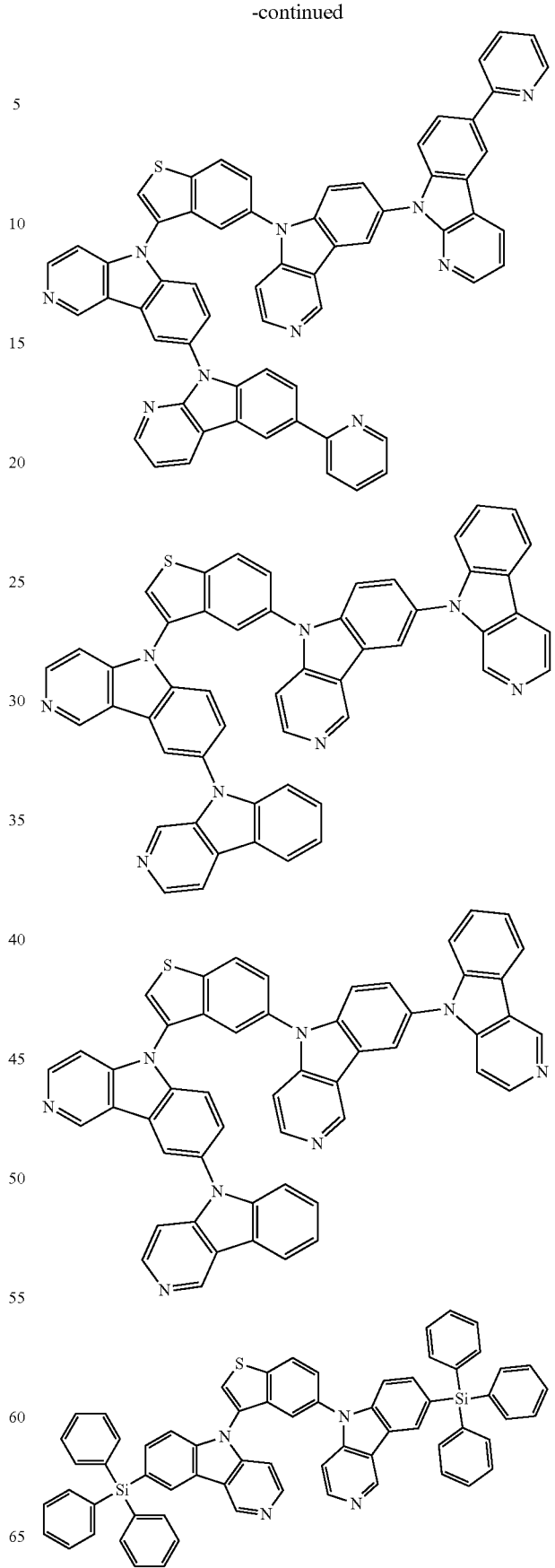

25
-continued
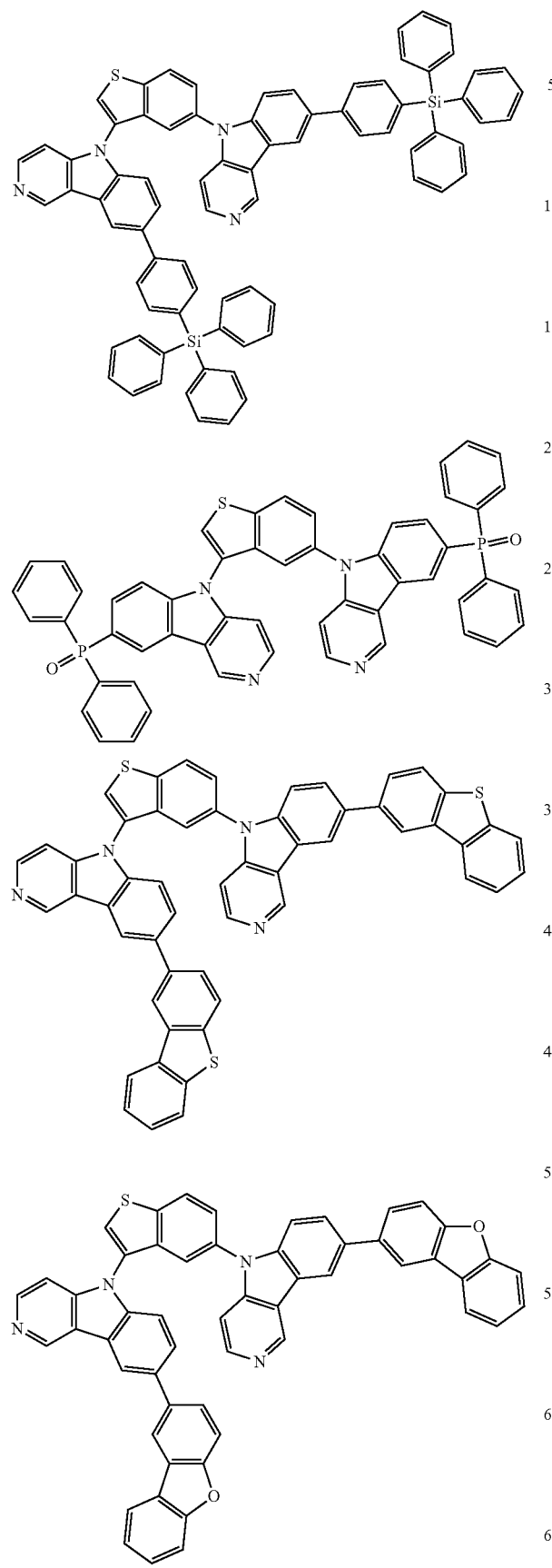
26
-continued
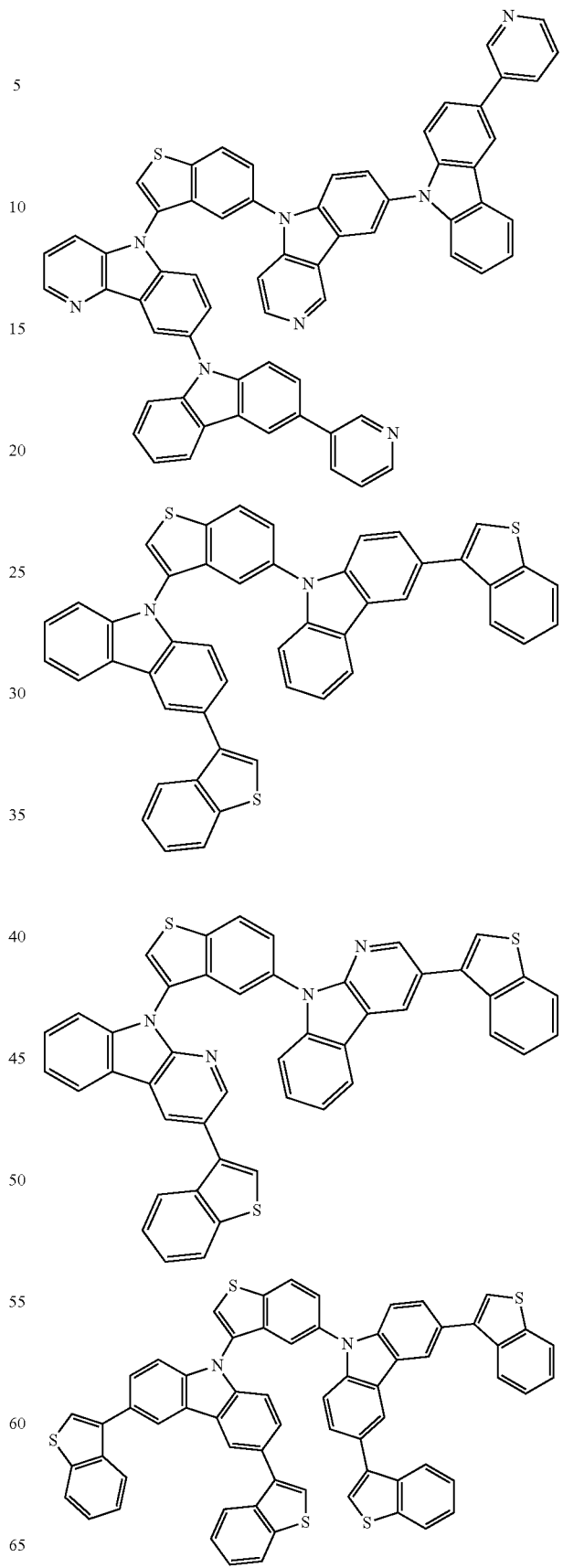

-continued

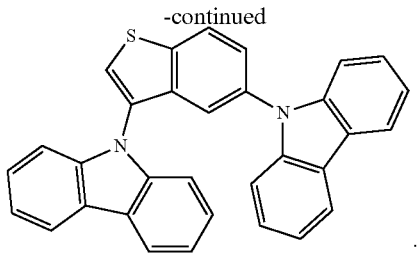

5. An organic light emitting diode device comprising an organic film formed between an anode and a cathode, the organic film comprising the phosphorescent compound of claim 1.

6. The organic light emitting diode device of claim 5, wherein the organic film is an emission layer.

7. The organic light emitting diode device of claim 5, wherein the emission layer emits green light or blue light.

8. The organic light emitting diode device of claim 5, wherein the compound is used as the host of the emission layer.

9. The organic light emitting diode device of claim 5, further comprising one or more selected from the group consisting of a hole injection layer, a hole transport layer, an electron transport layer, and an electron injection layer between the anode and the cathode.

* * * * *